United States Patent
Hwang et al.

(10) Patent No.: US 9,335,384 B2
(45) Date of Patent: May 10, 2016

(54) ADJUSTABLE MAGNETIC PROBE FOR EFFICIENT NEAR FIELD SCANNING

(71) Applicant: QUALCOMM Incorporated, San Diego, CA (US)

(72) Inventors: Kyu-Pyung Hwang, San Diego, CA (US); Young K. Song, San Diego, CA (US); Dong Wook Kim, San Diego, CA (US); Changhan Hobie Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 217 days.

(21) Appl. No.: 14/037,142

(22) Filed: Sep. 25, 2013

(65) Prior Publication Data

US 2015/0084623 A1    Mar. 26, 2015

(51) Int. Cl.
*G01R 33/02* (2006.01)
*G01R 29/08* (2006.01)

(52) U.S. Cl.
CPC ............ *G01R 33/02* (2013.01); *G01R 29/0814* (2013.01)

(58) Field of Classification Search
CPC ........................................................ G01R 33/02
USPC ........................................................ 324/244
See application file for complete search history.

(56) References Cited

U.S. PATENT DOCUMENTS

| | | | |
|---|---|---|---|
| 6,625,554 B2 | 9/2003 | Suga et al. | |
| 6,643,594 B2 | 11/2003 | Uesaka | |
| 6,875,920 B2 | 4/2005 | Nakamura et al. | |
| 7,098,677 B2 * | 8/2006 | Kazama et al. | 324/750.16 |
| 7,358,749 B2 * | 4/2008 | Kazama et al. | 324/754.27 |
| 2006/0152232 A1 * | 7/2006 | Shvets et al. | 324/750 |
| 2013/0024148 A1 | 1/2013 | Nakamura et al. | |

FOREIGN PATENT DOCUMENTS

JP    2000346886 A    12/2000

* cited by examiner

*Primary Examiner* — Bot Ledynh
(74) *Attorney, Agent, or Firm* — Arent Fox LLP

(57) ABSTRACT

A method and apparatus for testing near field magnetic fields of electronic devices. The method comprises measuring a magnetic field using a loop antenna that is oriented in a first direction. The loop antenna is swept through a desired range of azimuth angles while measuring the magnetic field. Once the first direction testing is completed, the loop antenna is changed to a second orientation direction. The magnetic field is then measured in the second orientation direction and is swept through a desired range of orientation angles in the second direction. The apparatus provides a loop antenna connected to a coaxial probe, with the coaxial cable serving as the center conductor, and two outer conductors. An axle is mounted to the loop antenna and connected to a step motor. A servo motor is also provided for moving the arm assembly.

20 Claims, 4 Drawing Sheets

ADJUSTABLE MAGNETIC PROBE FOR EFFICIENT NEAR FIELD SCANNING

BACKGROUND

1. Field

The present disclosure relates generally to wireless communication manufacturing testing as well as to electronic device testing in general. More specifically, the disclosure relates to an adjustable magnetic probe for efficient near field scanning

2. Background

As use of mobile devices grows, so does the need to manufacture and test new devices in an efficient manner. Magnetic probes are used in near field electromagnetic interference (EMI) scanning systems to measure the magnetic field component that is perpendicular to the probe loop. Existing magnetic probe mounting arms must be moved to a new position in order to measure magnetic field data in the x, y, and z directions. This requires that the probe arm be moved to the new position and calibrated before use, which is time consuming and mechanically cumbersome. Much time is consumed in repeatedly setting up the probe for a new direction of measurement. This is particularly problematic in high volume manufacturing.

There is a need in the art for method and apparatus for a magnetic probe capable of adjusting the direction of a loop antenna to collect fully-vectorial magnetic field data in the x, y, and z directions for use in chip, package, and board level EMI testing.

SUMMARY

Embodiments disclosed herein provide a method for testing near field magnetic fields of electronic devices. The method comprises measuring a magnetic field using a loop antenna that is oriented in a first direction. The loop antenna is then swept through a desired range of azimuth angles while measuring the magnetic field. The angles in the first orientation direction may be selected based on the characteristics of the electronic device being tested. Once the first direction testing is completed, the loop antenna is changed to a second orientation direction. The magnetic field is then measured in the second orientation direction and is swept through a desired range of orientation angles in the second direction.

A further embodiment provides an apparatus for near field magnetic probe testing. The apparatus comprises a loop antenna connected to a coaxial cable. The coaxial cable serves as the center conductor for the device. An axle is mounted to the loop antenna and is connected to a step motor that is used to sweep the antenna through a desired range of angles during testing. The loop antenna and coaxial cable are also provided with two outer conductors. A servo motor is also provided to adjust the loop antenna arm.

A still further embodiment provides an apparatus for testing near field magnetic fields of electronic devices. The apparatus provides means for measuring a magnetic field using a loop antenna oriented in a first direction. The apparatus also includes means for sweeping the loop antenna through a desired range of azimuth angles in the first orientation direction. The apparatus further includes means for changing the loop antenna orientation from a first orientation direction to a second orientation direction. Once in the second orientation direction, the apparatus uses means for measuring a magnetic field using the loop antenna oriented in the second direction. The apparatus also includes means for sweeping the loop antenna through a desired range of azimuth angles in the second orientation direction.

An additional embodiment provides a computer-readable non-transitory storage medium containing instructions. The instructions cause a processor to perform the steps of: measuring a magnetic field using a loop antenna oriented in a first direction; sweeping the loop antenna through a desired range of azimuth angles in the first orientation direction; changing the loop antenna orientation from a first orientation direction to a second orientation direction; measuring a magnetic field using the loop antenna oriented in the second direction; and sweeping the loop antenna through a desired range of azimuth angles in the second orientation direction.

DETAILED DESCRIPTION

Figure 1:
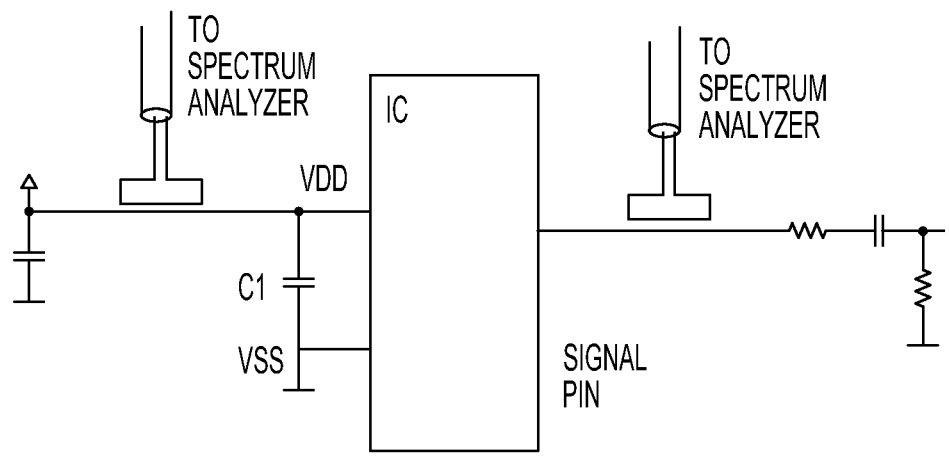
FIG. 1 depicts a schematic of magnetic field scanning for EMI testing, in accordance with certain embodiments of the disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Figure 3:
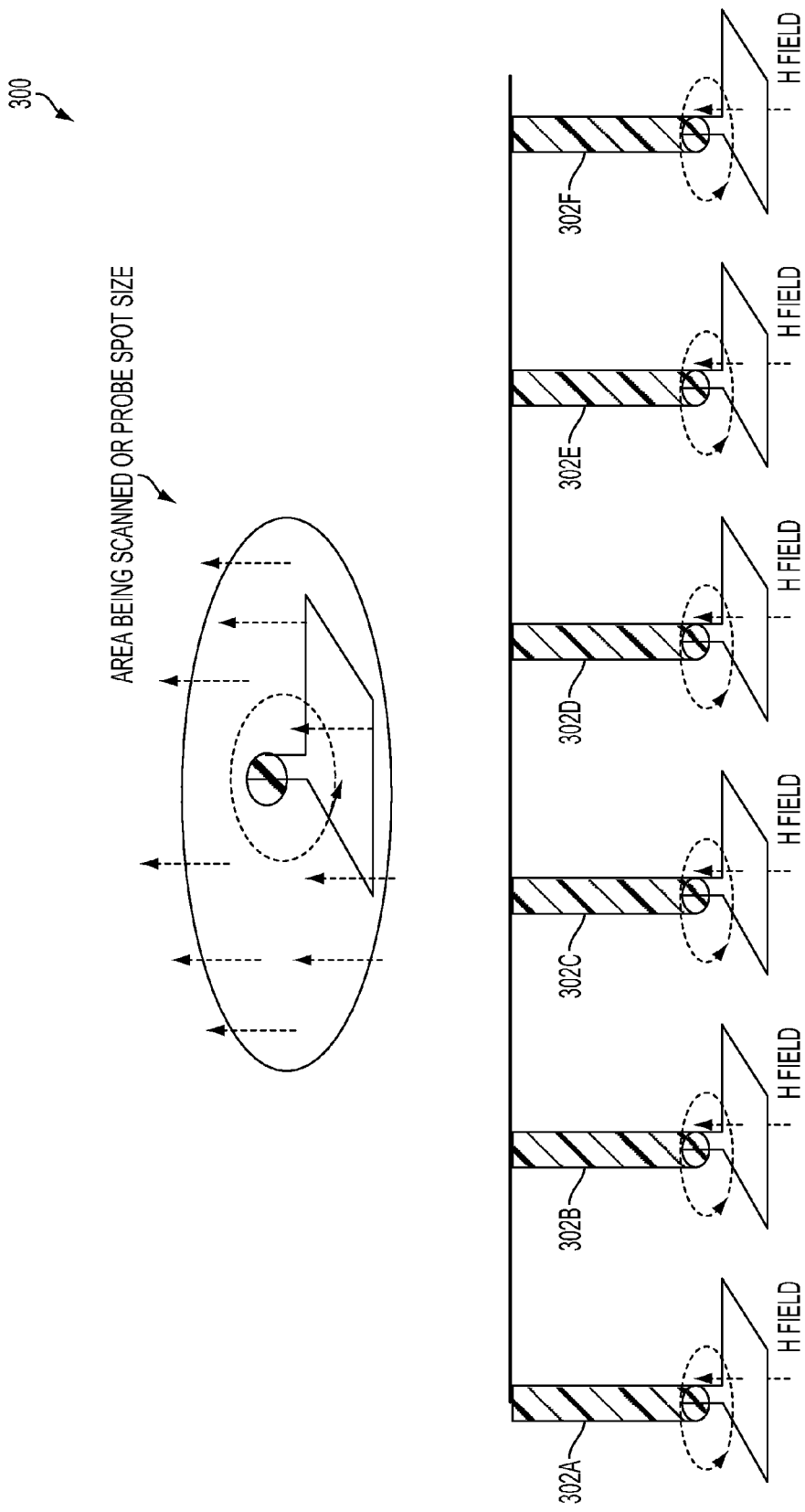
FIG. 3 depicts a series of magnetic probes in a factory test set up, according to an embodiment.
Figure 4:
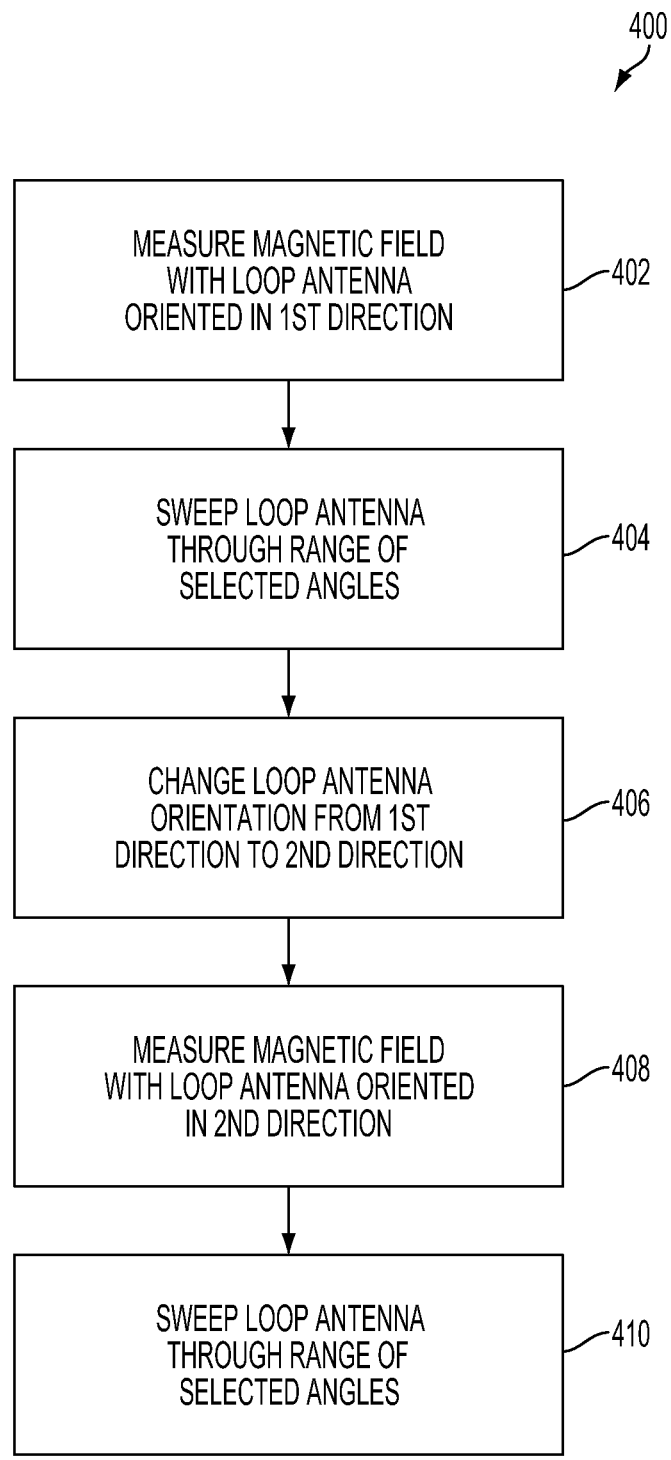
FIG. 4 shows a flow chart of a method for near field magnetic probe scanning, according to an embodiment.

Further, it should be appreciated that modules and/or other appropriate means for performing the methods and techniques described herein, such as those illustrated by FIGS. 3 and 4, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Near field magnetic probe testing is an important testing method used to identify EMI sources in integrated circuits (ICs), packages, and circuit board level devices. Existing probe systems have a loop antenna fixed in a mounting arm. Because the loop antenna is fixed in position, the arm must be moved in order to test all three magnetic field components (Hx, Hy, and Hz). The apparatus and method described herein provide a magnetic probe with a movable loop antenna that is capable of testing in three dimensions without moving the mounting arm.

FIG. 1 illustrates a typical testing set up for near field magnetic field testing. The loop antenna is placed in proximity to the stripline and in a direction perpendicular to the magnetic field being measured. Vdd is the power net used for the device being tested, which in this example is an integrated circuit (IC). Vss is the ground net for the IC. The IC may be mounted on a circuit board or may be mounted on a special test board. Typically the probe is like a loop antenna attached to the center conductor and the outer conductor as shown in FIG. 1. In the typical test set up the near field magnetic image shows only the magnitude of the magnetic field, and not the direction of the magnetic field.

In the typical test set up the loop antenna measures the magnetic field perpendicular to the probe loop. The loop is fixed in position and cannot be adjusted to measure in different directions. To measure the magnetic field in a different direction requires that the arm be moved and then recalibrated. In small volume manufacturing this arrangement leads to multiple time consuming recalibrations. Calibration is performed using fixed devices with know field generating behaviors.

Figure 2:
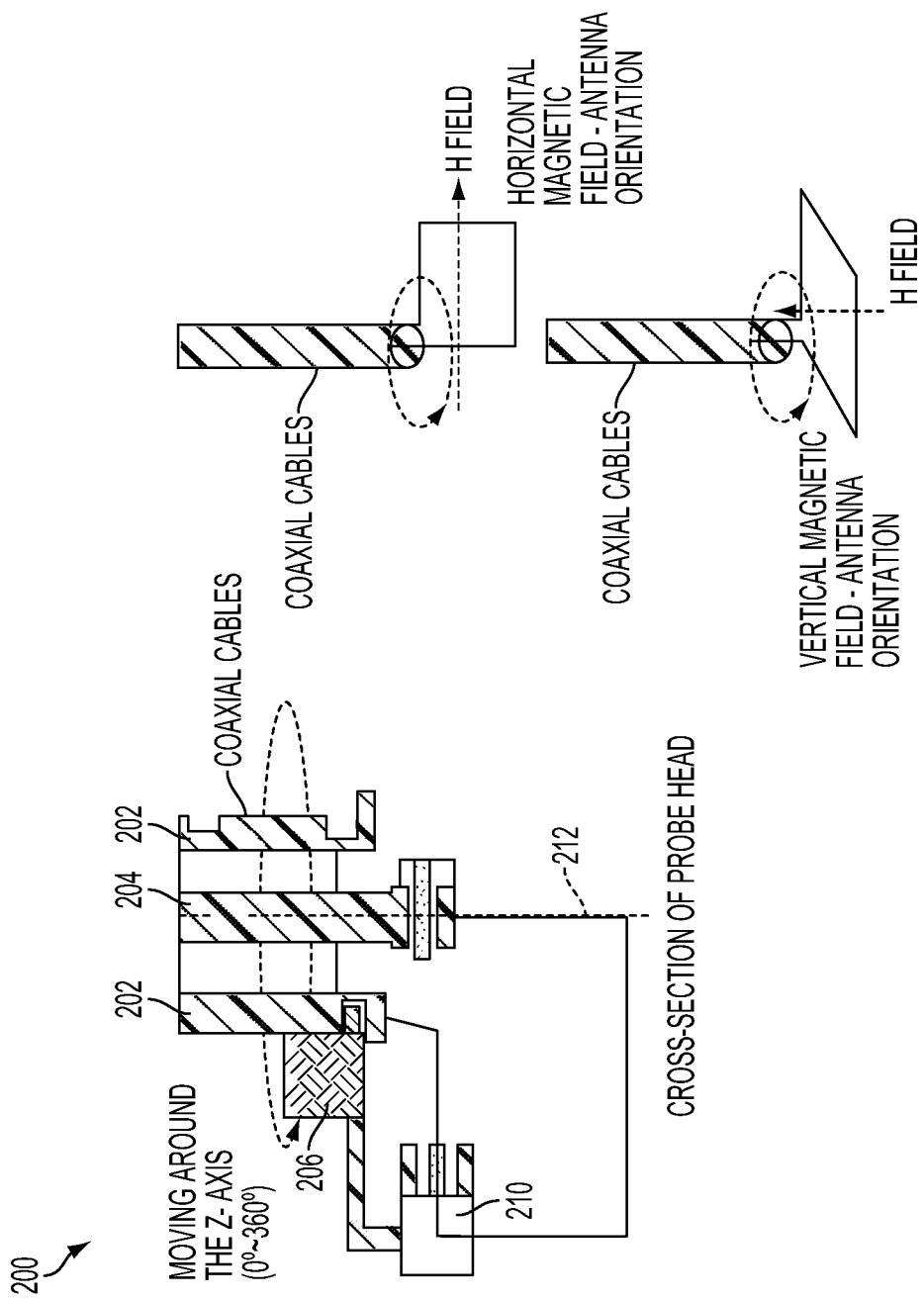
FIG. 2 illustrates a magnetic probe capable of adjusting its loop direction in the x, y, and z directions in accordance with certain embodiments of the disclosure.

FIG. 2 illustrates an adjustable magnetic probe 200 for efficient near field scanning in accordance with an embodiment. The probe is capable of moving in the z-axis, from 0 degrees through 360 degrees. This movement is about a center conductor 204. A servo motor 206 provides azimuthal angle movement, while a stepper motor 210 is used to flip, or re-orient the loop between the horizontal and vertical positions. The outer conductors 202 may be coaxial cable. Additional illustrations shown with FIG. 2 show how the loop position may be varied to capture a horizontal magnetic field component and a vertical magnetic field component. Note how the loop position is perpendicular to the direction of the magnetic field to be measured.

FIG. 2 provides a movable and adjustable probing structure that is attached to coaxial cable outer conductor 202. The loop antenna 212 pivots around the center conductor. The loop antenna 212 may be moved in azimuth from 0 degrees through 360 degrees. This movement may be continuous during testing. A servo motor 206 may provide the impetus for the movement in azimuth. A step motor 210 may be used to move or flip the loop antenna 212 between the horizontal and vertical positions. FIG. 2 illustrates the movement of the loop antenna 212 in two axes.

FIG. 3 depicts multiple test arms configured to test multiple devices at the same time. The assembly 300, includes adjustable magnetic probes 302A-302F. The assembly 300 may include more adjustable magnetic probes 302 than is shown in FIG. 3, or may include fewer. This setup may be varied to accommodate the type and number of devices being tested. The assembly 300 allows for a reduction in the time needed to scan a single device under test, or may scan many devices in parallel as part of a high volume manufacturing environment. The adjustable probe head 302 may also increase the probe spot size, as depicted in FIG. 3, by sweeping the loop around the z-axis within the coaxial cable. While FIG. 3 shows all of the probes 302A-302F measuring in the same orientation, this is not necessary, as the probes 302A-302F may measure multiple directions and swing in different angles and directions. Probe spots may also be different sizes.

FIG. 4 illustrates the steps of a method 400 for testing near field magnetic fields of electronic devices. In step 402 the magnetic field is measured with the loop antenna oriented in a first direction. The loop antenna is swept through a range of selected angles in step 404. Once this measurement is completed the loop antenna orientation is changed from the first orientation direction to the second orientation direction in step 406. In step 408 the magnetic field is measured with the loop antenna oriented in the second direction. The loop antenna is then again swept through a range of selected angles in step 410. The measurements obtained provide guidance as to further adjustments to the design of the device.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for testing near field magnetic fields of electronic devices, comprising:
    measuring a magnetic field using a loop antenna in a first orientation direction with respect to a conductor connected to the loop antenna;
    sweeping the loop antenna, around a first axis, through a desired range of azimuth angles in the first orientation direction;
    changing the loop antenna orientation, around a second axis, from the first orientation direction to a second orientation direction with respect to the conductor;
    measuring a magnetic field using the loop antenna in the second orientation direction; and
    sweeping the loop antenna through a desired range of azimuth angles in the second orientation direction.

2. The method of claim 1, further comprising increasing a probe spot size.

3. The method of claim 1, further comprising decreasing a probe spot size.

4. The method of claim 1, further comprising testing multiple devices using multiple probe arms controlled by a controller.

5. The method of claim 4, wherein the multiple probe arms use the same probe spot size.

6. The method of claim 4, wherein the multiple probe arms use at least two probe spot sizes.

7. An apparatus for testing near field magnetic fields of electronic devices, comprising:
    means for measuring a magnetic field using a loop antenna in a first orientation direction with respect to a conductor connected to the loop antenna;
    means for sweeping the loop antenna, around a first axis, through a desired range of azimuth angles in the first orientation direction;
    means for changing the loop antenna orientation, around a second axis, from the first orientation direction to a second orientation direction with respect to the conductor;
    means for measuring a magnetic field using the loop antenna in the second orientation direction; and
    means for sweeping the loop antenna through a desired range of azimuth angles in the second orientation direction.

8. The apparatus of claim 7 further comprising means for increasing probe spot size.

9. The apparatus of claim 7, further comprising means for decreasing probe spot size.

10. The apparatus of claim 7, further comprising means for testing multiple devices using multiple probe arms controlled by a controller.

11. A computer-readable non-transitory storage medium, containing instructions, which when executed cause a processor to perform the steps of:
    measuring a magnetic field using a loop antenna in a first orientation direction with respect to a conductor connected to the loop antenna;

sweeping the loop antenna, around a first axis through a desired range of azimuth angles in the first orientation direction;

changing the loop antenna orientation, around a second axis, from the first orientation direction to a second orientation direction with respect to the conductor;

measuring a magnetic field using the loop antenna in the second orientation direction; and sweeping the loop antenna through a desired range of azimuth angles in the second orientation direction.

12. The computer-readable non-transitory storage medium of claim 11, further comprising instructions for controlling multiple adjustable magnetic probes controlled using one controller.

13. The computer-readable non-transitory storage medium of claim 11, further comprising instructions for adjusting a loop antenna to increase a probe spot size and to rotate the loop antenna around a z-axis.

14. The computer-readable non-transitory storage medium of claim 11, further comprising instructions for increasing a probe spot size.

15. The computer-readable non-transitory storage medium of claim 11, further comprising instructions for decreasing a probe spot size.

16. The computer-readable non-transitory storage medium of claim 11, further comprising instructions for controlling multiple probe arms.

17. The computer-readable non-transitory storage medium of claim 16, further comprising instructions for controlling multiple probe arms having at least two different probe spot sizes.

18. An apparatus for near field magnetic probe testing, comprising:
a loop antenna connected to a conductor, wherein the loop antenna is configured to
measure a magnetic field with the loop antenna in a first orientation direction with respect to the conductor,
sweep, around a first axis, through a desired range of azimuth angles in the first orientation direction,
change orientation, around a second axis, from the first orientation direction to a second orientation direction with respect to the conductor;
measure a magnetic field using the loop antenna in the second orientation direction; and
sweep through a desired range of azimuth angles in the second orientation direction.

19. The apparatus of claim 18, wherein the loop antenna is further configured to rotate around the first axis to adjust a probe spot.

20. The apparatus of claim 19, wherein the conductor extends alone the first axis.

* * * * *